United States Patent
Imai

[11] Patent Number: 5,960,762
[45] Date of Patent: Oct. 5, 1999

[54] PISTON RING AND CYLINDER LINER COMBINATION

[75] Inventor: Toshiaki Imai, Okaya, Japan

[73] Assignee: Teikoku Piston Ring Co., Ltd., Tokyo, Japan

[21] Appl. No.: 08/998,021

[22] Filed: Dec. 24, 1997

[30] Foreign Application Priority Data

Dec. 26, 1996 [JP] Japan ..................................... 8-356987

[51] Int. Cl.$^6$ .................................. F02F 5/00; F02F 1/08
[52] U.S. Cl. ........................................ 123/193.4; 277/440
[58] Field of Search ............................. 123/193.2, 193.4, 123/193.3, 193.6; 277/440, 443; 428/217, 236, 570; 427/250

[56] References Cited

U.S. PATENT DOCUMENTS

| | | | |
|---|---|---|---|
| 5,154,433 | 10/1992 | Naruse | 277/443 |
| 5,315,970 | 5/1994 | Rao et al. | 123/193.2 |
| 5,587,227 | 12/1996 | Ooya | 428/217 |
| 5,672,386 | 9/1997 | Ooya | 427/250 |
| 5,743,536 | 4/1998 | Komuro et al. | 277/440 |
| 5,763,106 | 6/1998 | Blanchard et al. | 428/570 |
| 5,773,734 | 6/1998 | Young | 75/243 |
| 5,851,659 | 12/1998 | Komuro et al. | 428/236 |

FOREIGN PATENT DOCUMENTS

| 5-38061 | 6/1993 | Japan . |
|---|---|---|
| 7-164131 | 6/1995 | Japan . |

*Primary Examiner*—Marguerite McMahon
*Attorney, Agent, or Firm*—Armstrong, Westerman, Hattori, McLeland & Naughton

[57] ABSTRACT

An outer circumferential surface of a piston ring is covered with a physical vapor deposition film, chemical vapor deposition film or composite chromium plating film. The physical vapor deposition film or chemical vapor deposition film consists of chromium or titanium nitrides (for instance CrN, $Cr_2N$, a mixture of Cr and $Cr_2N$, TiN) or carbides (for instance CrC, TiC). The composite chromium plating film contains carbides (for instance SiC) or nitrides (for instance $Si_3N_4$) or oxides (for instance $Al_2O_3$) in cracks in the film. A cylinder liner is made of spheroidal graphite cast iron.

6 Claims, 5 Drawing Sheets

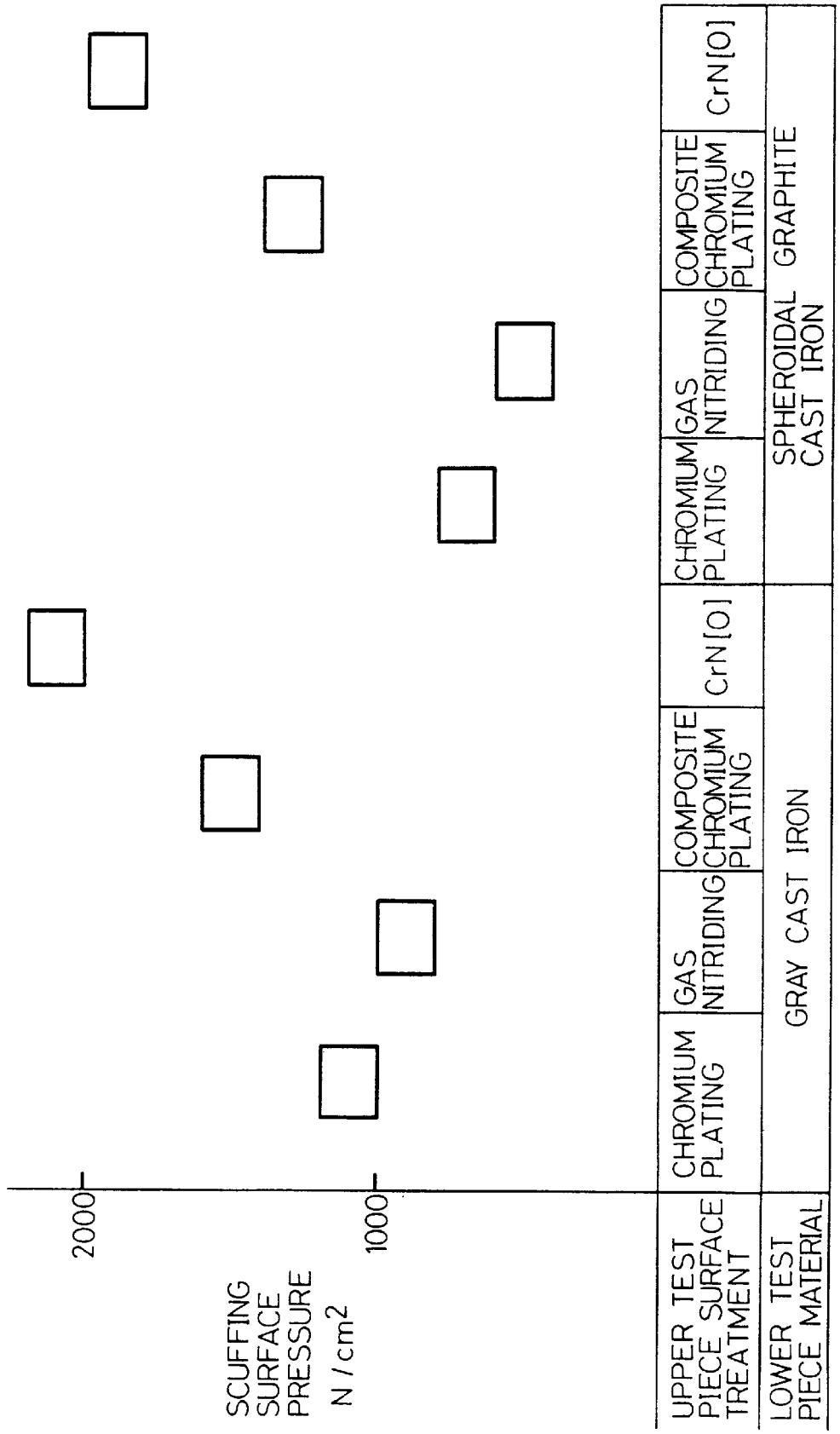

PISTON RING AND CYLINDER LINER COMBINATION

BACKGROUND OF THE INVENTION

1. Technical Field of the Invention

This invention relates to a piston ring and cylinder liner combination for internal combustion engines.

2. Description of the Related Art

In recent years demands have been made for stronger cylinder liners to match high engine output. To meet these demands, a composite cylinder liner comprising an inner layer of special cast iron with superior wear resistance and scuffing resistance and an outer layer of graphite steel with superior toughness was proposed in Japanese Patent Publication No. 5-38061. Further, in Japanese Laid-Open Patent No. 7-164131, spheroidal graphite cast iron material with superior toughness was utilized in the cylinder block and the method which prevents a decrease in wear resistance, in other words, the phenomenon that the periphery of the spheroidal graphite is covered by means of the plastic deformation of the base material by hardening the base material of the sliding portions was proposed.

However, the piston ring operating environment has become much harsher due to high engine output, making the use of treatment technologies such as physical vapor deposition processing or chemical vapor deposition processing on the outer circumference of the ring. These methods are referred as plating in a dry process or reactive vapor deposition and serve to maintain high wear resistance and high scuffing resistance.

The composite chromium plating film is known as a hard film treatment in a wet process and provides high wear resistance and scuffing resistance equivalent to the hard film formed by physical vapor deposition processing or chemical vapor deposition processing.

In the above-mentioned liner and block technologies, the liner and block were made of high grade cast iron, and improvements and improved surface for the liner and block were adopted as countermeasures to the disadvantage of the high grade cast iron material, namely that sliding characteristics were weaker than gray cast iron material.

In the above-mentioned piston ring technology, there were no particular specifications for the material of the cylinder liner. However, the embodiments of engine tests using the gray cast iron liner and resultant explanations suggest that a mating material is gray cast iron material which provides superior wear resistance and scuffing resistance.

SUMMARY OF THE INVENTION

It is an object of this invention to provide a piston ring and cylinder liner combination having improved strength of the cylinder liner and also having improved sliding characteristics, (wear resistance and scuffing resistance) of the piston ring and cylinder liner.

This invention is a piston ring and cylinder liner combination for internal combustion engines, wherein the cylinder liner is made of spheroidal graphite cast iron and the outer circumferential surface of the piston ring is covered with a physical vapor deposition film, a chemical vapor deposition film or a composite chromium plating film.

The cylinder liner is made of spheroidal graphite cast iron to provide a liner of greater strength and lighter weight.

Methods to strengthen the cylinder liner up until now have resulted in loss of cylinder liner sliding characteristics, so that this drawback had to be compensated by improving the cylinder liner itself or improving surface quality. This invention however makes up for the drawback of poor sliding characteristics by means of piston ring performance. In other words, forming a physical vapor deposition film, a chemical vapor deposition film or a composite chromium plating film on the outer circumferential surface of the piston ring which slides on the cylinder liner of spheroidal graphite cast iron compensates for loss of cylinder liner sliding characteristics to improve the resistance to wear and resistance to scuffing.

BRIEF DESCRIPTION OF THE DRAWINGS

The aforesaid and other objects and features of the present invention will become more apparent from the following detailed description and the accompanying drawings.

FIG. 1a is a longitudinal cross sectional view of a portion of the piston ring. FIG. 1b is a longitudinal cross sectional view of the cylinder liner.

FIG. 5 is a graph showing data from the high surface pressure scuffing test.

DESCRIPTION OF THE PREFERRED EMBODIMENTS

Figure 1A:
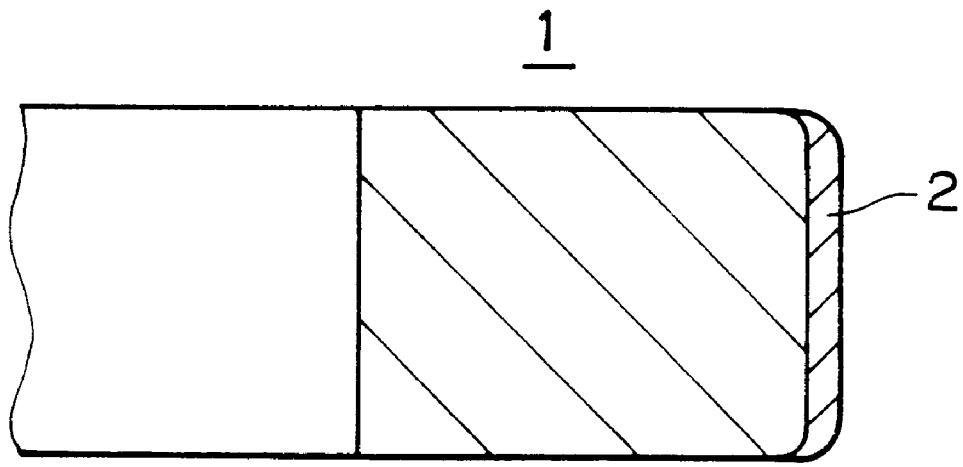
FIGS. 1a and 1b show an embodiment of this invention.
Figure 1B:
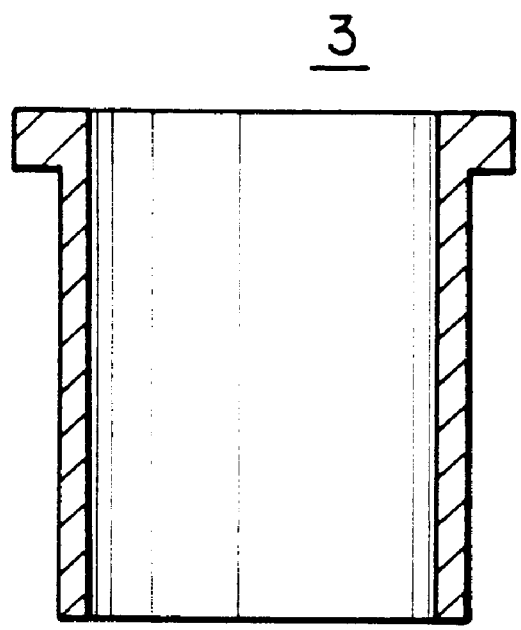

FIGS. 1a and 1b show an embodiment of this invention. FIG. 1a is a longitudinal cross sectional view of a portion of the piston ring. FIG. 1b is a longitudinal cross sectional view of the cylinder liner.

The outer circumferential surface of a piston ring 1 is covered with a physical vapor deposition film, a chemical vapor deposition film or a composite chromium plating film 2. The physical vapor deposition film or chemical vapor deposition film consists of chromium or titanium nitrides (for instance CrN, $Cr_2N$, a mixture of Cr and $Cr_2N$, TiN) or carbides (for instance CrC, TiC). The composite chromium plating film contains carbides (for instance SiC) or nitrides (for instance $Si_3N_4$) or oxides (for instance $Al_2O_3$) in cracks in the film.

A cylinder liner 3 is made of spheroidal graphite cast iron.

The reciprocating wear test and the high surface pressure scuffing test performed to confirm the effect of this invention are explained next.

(A) Reciprocating wear test (1) Reciprocating friction testing machine

Figure 2:
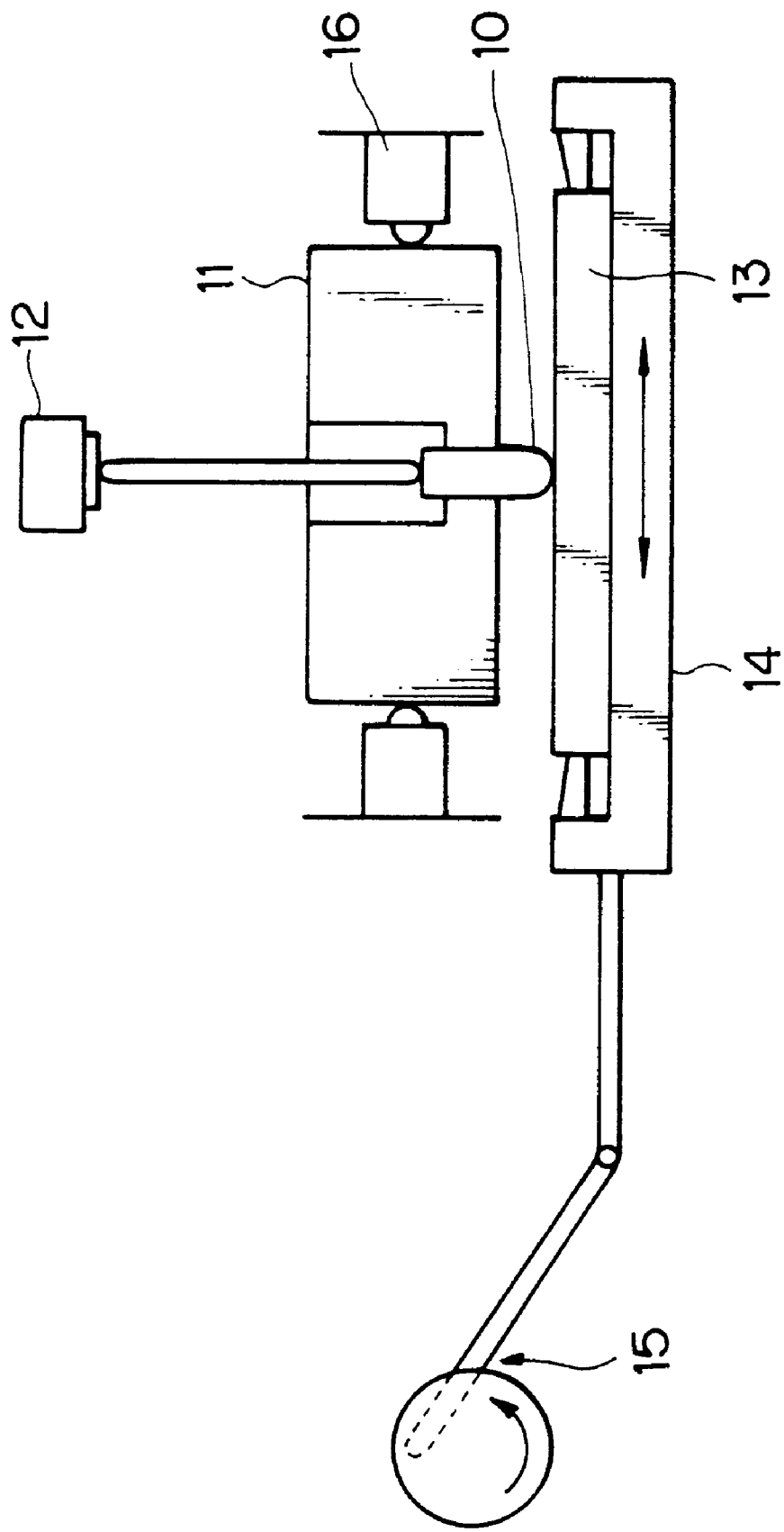
FIG. 2 is a drawing showing an outline of the reciprocating friction testing machine.

FIG. 2 shows the structure of the reciprocating friction testing machine. A pin-shaped upper test piece 10 corresponding to ring is supported by a fixed block 11, and a downward load is applied to the upper test piece 10 from above by a hydraulic cylinder 12 to press the upper test piece 10 against a lower test piece 13 described later. The flat base shaped lower test piece 13 corresponding to liner is supported by a movable block 14 and moved back and forth by a crank mechanism 15. The numeral 16 denotes a load cell.

(2) Test conditions

① Test nieces

Upper test piece 10: The end surface of the steel rod (diameter 8 mm, length 25 mm) was formed into a spherical surface with a radius of 18 mm. The material of the rod was 17% Cr martensitic stainless steel. The following surface treatment was performed on the spherical surface of the rod.

Hard chromium plating (surface hardness HV900, film thickness 100 μm)

Gas nitriding (surface hardness HV1100, film thickness 100 μm)

Composite chromium plating (surface hardness HV800, $Si_3N_4$ particles with dispersion ratio of 8 percent by volume, film thickness 100 μm)

Forming of CrN film with oxygen in solid solution state (hereafter CrN[O] film) by arc ion plating. (surface hardness HV1800, oxygen contained in solid solution state at 8 percent by weight, film thickness 50 μm)

Lower test piece 13: The lower test piece was a flat plate (length 70 mm, width 17 mm, height 14 mm) and its material was as follows.

Gray cast iron (material equivalent to JIS FC250, hardness HRB90, pearlite matrix)

Spheroidal graphite cast iron (spheroidizing ratio of 80%, hardness HRB110, martensite matrix)

② Surface treatment conditions for user test piece 10

Hard chromium plating

Plating bath : $CrO_3$ 250 g/l
    $H_2SO_4$ 2.5 g/l

Bath temperature : 55° C.

Electric current density : 50 A/dm²

Plating time : 5 hours

Gas nitriding

Furnace internal temperature : 843° K.

Reactive gas : $NH_3+N_2$

Composite chromium plating

Plating bath : $CrO_3$ 250 g/l
    $H_2SO_4$ 2.5 g/l
    $H_2SiF_6$ 5 g/l $Si_3N_4$ (Average particle size 1.0 μm) : in suitable quantity Bath temperature : 55° C.

Electric current density : Plating 50 A/dm²
    Etching 50 A/dm²

Plating (one cycle) : Plating 600 seconds
    Etching 60 seconds

Arc ion plating

Apparatus : Arc ion plating apparatus

Bias voltage : 5 volts

Furnace internal pressure : 1.33 Pa

③ Test conditions

Sliding speed : 1 m/s

Load : 198N

Time: 60 minutes

Lubricating oil : Bearing oil equivalent to light oil (3) Test results

Figure 3:
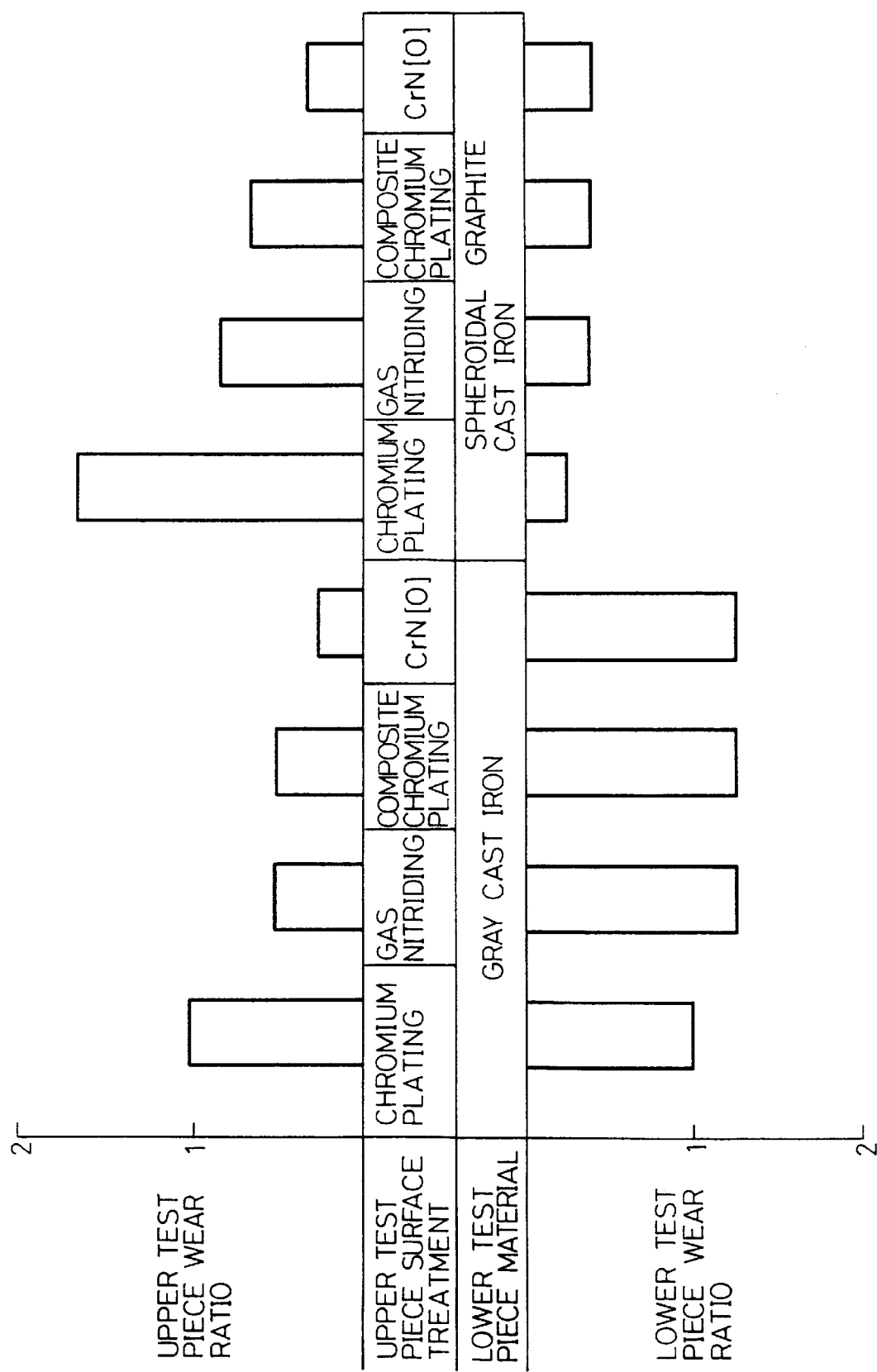
FIG. 3 is a graph showing data from the reciprocating wear test.

As FIG. 3 clearly shows, when the liner material is spheroidal graphite cast iron and the film formed on the ring is CrN[O] film or composite chromium plating film, the amount of wear on both liner and ring is low, demonstrating superior resistance to wear.

Figure 4:
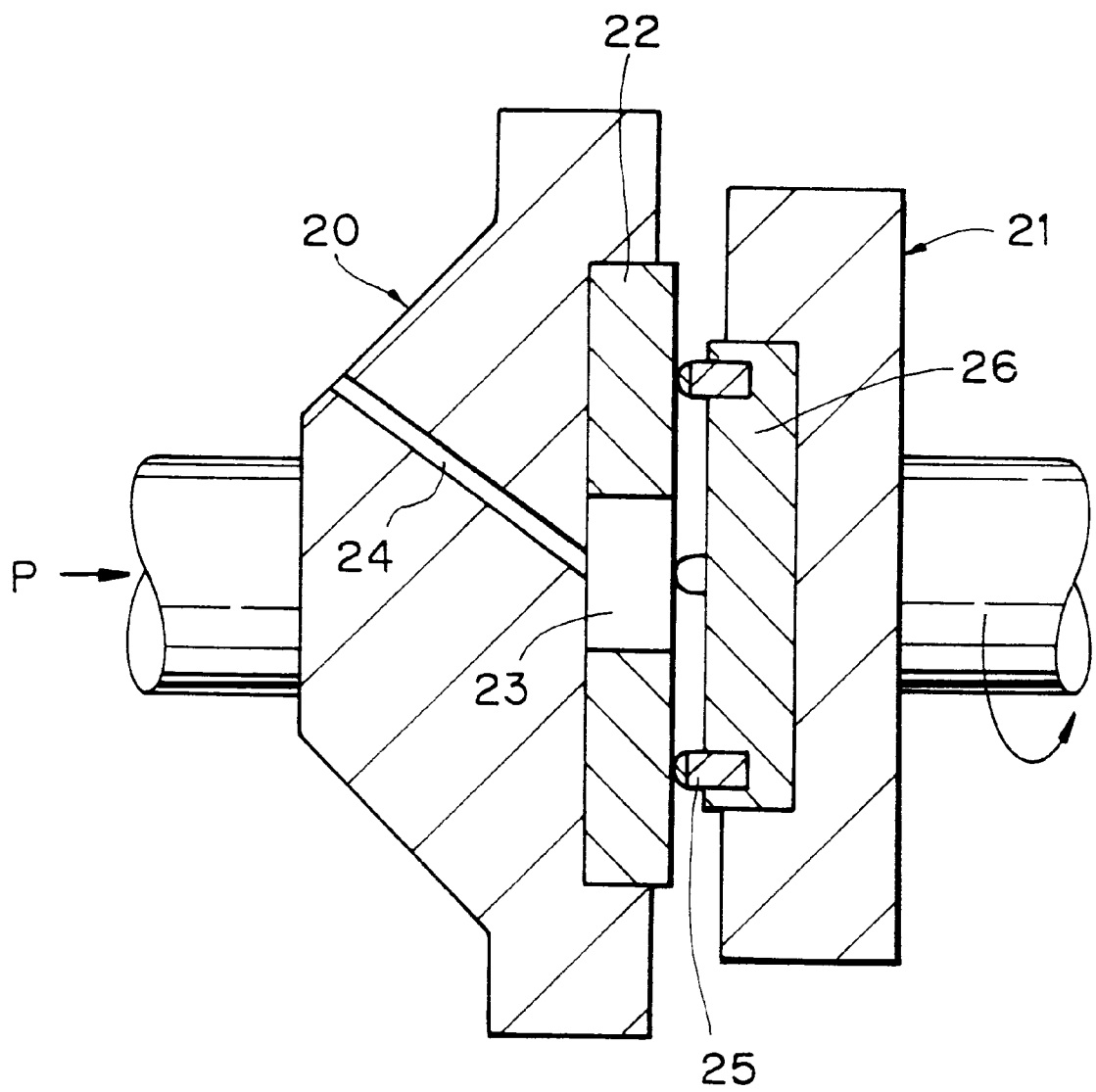
FIG. 4 is a drawing showing an outline of the high surface pressure scuffing testing machine.

(B) High surface pressure scuffing test (1) High surface pressure scuffing testing machine FIG. 4 shows the structure of the high surface pressure scuffing testing machine. A stator 20 has a circular concavity on the surface facing a rotor 21 described later. A disk 22 corresponding to liner is fixed in this concavity. The disk 22 protrudes toward the rotor 21. The surface of the disk 22 facing the rotor 21 is formed into a perpendicular flat surface. An oil hole 23 is formed in the center section of the disk 22 in the axial direction of the stator 20. An oil hole 24 which is communicated with the oil hole 23 is formed obliquely in the stator 20. Lubricating oil is supplied to the contact portions between the disk 22 of the stator 20 and a pin 25 described later by way of the oil holes 23 and 24.

The rotor 21 revolves around the horizontal axis and has a circular concavity formed on the surface facing the stator 20. A disc-shaped pin holder 26 in this concavity is fixed concentrically to the rotor 21. Four concavities equally spaced on the same circle are formed on the surface of the pin holder 26 facing the stator 20. The pin 25 corresponding to ring is inserted and fixed in each of these concavities. Each pin 25 protrudes horizontally from the surface of the pin holder 26 toward the stator 20.

The projecting end surface of each pin 25 is performed the same surface treatment as the upper test piece 10 in the above-mentioned reciprocating wear test and their end surfaces are in contact with the surface of the disk 22 of the stator 20.

Therefore, a load P is applied to the stator 20 to press the disk 22 against the pin 25. Lubricating oil is supplied to the contact portions between the pin 25 and the disk 22 by means of the oil holes 23 and 24 while the rotor 21 is made to rotate.

The rotor 21 is set to a constant sliding speed and when a varying load is applied, the load at which scuffing of the pin 25 occurs is measured and the scuffing surface pressure then calculated.

(2) Test conditions

① Test pieces

Pin 25 : The end surface of the steel rod (diameter 8 mm, length 25 mm) was formed into a spherical surface with a radius of 18 mm. The material of the rod was 17% Cr martensitic stainless steel. The spherical surface received the same surface treatment as the upper test piece 10 for the above mentioned reciprocating wear test.

Disk 22 : Diameter 80 mm, thickness 10 mm. The material was as follows.

Gray cast iron (material equivalent to JIS FC250, hardness HRB90, pearlite matrix)

Spheroidal graphite cast iron (spheroidizing ratio of 80%, hardness HRB110, martensite matrix)

② Test conditions

Sliding speed : 8 m/s

Load : Initial load of 20 kgf, then 10 kgf added every 3 minutes afterward

Lubricating oil : Engine oil 10W 80° C., added at 400 cc/min (3) Test results

As FIG. 5 clearly shows, when the liner material is spheroidal graphite cast iron and the film formed in the ring is CrN[O] film or composite chromium plating film, the scuffing surface pressure is high, demonstrating superior resistance to scuffing.

Although the present invention has been described with reference to the preferred embodiments, it is apparent that the present invention is not limited to the aforesaid preferred embodiments, but various modification can be attained without departing from its scope.

What is claimed is:

1. A piston ring and cylinder liner combination for internal combustion engines, wherein said cylinder liner is made of spheroidal graphite cast iron and said piston ring is formed on its outer circumferential surface with a physical vapor deposition film, chemical vapor deposition film or composite chromium plating film, and the spheroidal graphite cast iron is exposed on the inner circumferential surface of said cylinder liner which contacts said piston ring.

2. A piston ring and cylinder liner combination as claimed in claim 1, wherein said physical vapor deposition film consists of chromium or titanium nitrides.

3. A piston ring and cylinder liner combination as claimed in claim 1, wherein said physical vapor deposition film consists of chromium or titanium carbides.

4. A piston ring and cylinder liner combination as claimed in claim 1, wherein said chemical vapor deposition film consists of chromium or titanium nitrides.

5. A piston ring and cylinder liner combination as claimed in claim 1, wherein said chemical vapor deposition film consists of chromium or titanium carbides.

6. A piston ring and cylinder liner combination as claimed in claim 1, wherein said composite chromium plating film contains carbides, nitrides or oxides in cracks in the film.

* * * * *